United States Patent
Gardner et al.

(10) Patent No.: US 6,245,638 B1
(45) Date of Patent: *Jun. 12, 2001

(54) TRENCH AND GATE DIELECTRIC FORMATION FOR SEMICONDUCTOR DEVICES

(75) Inventors: Mark I. Gardner, Cedar Creek; H. Jim Fulford; Charles E. May, both of Austin, all of TX (US)

(73) Assignee: Advanced Micro Devices, Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/128,235

(22) Filed: Aug. 3, 1998

(51) Int. Cl.$^7$ .................................................. H01L 21/76
(52) U.S. Cl. .......................... 438/424; 438/435; 438/437; 438/296; 148/DIG. 50
(58) Field of Search ..................................... 438/424, 435, 438/437, 296; 148/DIG. 50

(56) References Cited

U.S. PATENT DOCUMENTS

| | | | |
|---|---|---|---|
| 5,780,346 | * 7/1998 | Arghavani et al. | 438/296 |
| 5,994,200 | * 11/1999 | Kim | 438/425 |
| 6,051,480 | * 4/2000 | Moore et al. | 438/435 |
| 6,060,369 | * 5/2000 | Gardner et al. | 438/407 |
| 6,087,243 | * 7/2000 | Wang | 438/424 |

OTHER PUBLICATIONS

S. Wolf, Silicon Processing For The VLSI ERA—vol. II: *Process Integration*, pp. 28–58 (Copyright © 1990 by Lattice Press).

* cited by examiner

*Primary Examiner*—Trung Dang

(57) ABSTRACT

Semiconductor device fabrication techniques which integrate the formation of trench isolation areas and gate insulating layers are provided. The fabrication techniques include forming one or more sacrificial layers, such as nitrided oxide layers, over regions of the substrate adjacent to a trench isolation region. The sacrificial layers are then removed prior to gate insulating layer formation. The formation of the sacrificial layers improves the trench structure and also improves the substrate surface for the subsequent formation of the gate insulating layer and gate electrode.

23 Claims, 3 Drawing Sheets

TRENCH AND GATE DIELECTRIC FORMATION FOR SEMICONDUCTOR DEVICES

FIELD OF THE INVENTION

The present invention is, in general, directed to a semiconductor device having trench isolation regions and methods for making the semiconductor device. More particularly, the present invention relates to method of forming trench and gate dielectric layers of a semiconductor device with a trench isolation region.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. Such silicon-based semiconductor devices often include metal-oxide-semiconductor (MOS) transistors, complimentary MOS (CMOS) transistors, bipolar transistors, bipolar CMOS (BiCMOS) transistors, etc.

Each of these semiconductor devices generally include a semiconductor substrate on which a number of active devices are formed. The particular structure of a given active device can vary between device types. For example, in MOS transistors, an active device generally includes source and drain regions and a gate electrode which modulates current between the source and drain regions.

A typical MOS semiconductor device 50 generally includes a semiconductor substrate 52 on which a gate electrode 54 is disposed, as shown in FIG. 1. The gate electrode 54, which acts as a conductor, receives an input signal to control operation of the device. Source and drain regions 56 are typically formed in regions of the substrate adjacent the gate electrode by heavily doping these regions with a dopant material of a desired conductivity. The conductivity of the doped region depends on the type of impurity used to dope the region. The collective term source/drain region is used herein to generally describe an active region used for the formation of either a source or drain.

A channel region 58 is formed in the semiconductor substrate beneath the gate electrode 54 and between the source and drain regions 56. The channel is often lightly doped with a dopant material having a conductivity type opposite to that of the source and drain regions. The gate electrode is generally separated from the substrate by a gate insulating layer 60, typically an oxide layer such as $SiO_2$. The gate insulating layer is provided to restrain current from flowing between the gate electrode 54 and the source, drain or channel regions 56, 58.

MOS devices typically fall in one of two groups depending the type of dopant materials used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

Semiconductor devices, like the ones mentioned above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral and vertical dimensions of the device structure.

One important step in the formation of semiconductors is the process of forming isolation regions, i.e., regions in the substrate which are used to electrically isolate adjacent active devices. Two common techniques for isolating active devices on a semiconductor substrate are LOCOS (for LOCal Oxidation of Silicon) isolation and trench isolation. Trench isolation techniques, and many LOCOS isolation techniques, generally involve the formation of a trench in the substrate. The formation of the trench typically begins by forming a pad oxide layer and then a nitride layer on the substrate. The pad oxide layer and the nitride layer are patterned and etched to expose the substrate and define the regions. The exposed substrate is then etched to form the trench. In most cases, an oxide layer is thermally grown in the trench to form at least part of the isolation region. A dielectric material is then deposited over the grown oxide layer to fill the trench. A more detailed discussion of LOCOS and trench isolation techniques can be found in S. Wolf, Silicon Processing For The VLSI Era, Vol. 2: Processing Integration, Ch. 2, pp. 28–58, 1990.

One concern with trench isolation is the uniformity of the trench/substrate interface, particularly near the upper surface of the substrate (i.e., the trench edge). The formation of an oxide layer by thermal oxidation utilizes a portion of the substrate from the sidewalls and bottom of the trench. This typically results in rounded corners and edges of the trench. Although this is often useful for the bottom corners of the trench, as it may permit more uniform dielectric material deposition in the trench, the rounding of the upper edges of the trench can affect device properties due to nonuniformity. In addition, silicon nitride deposits may be formed under the pad oxide layer during the thermal oxidation of the trench. This occurs as nitrogen from the nitride layer over the pad oxide layer diffuses through the pad oxide and reacts with the silicon substrate. The presence of these silicon nitride deposits can result in a weakened or thinner gate insulating layer that is formed, for example, by oxidation of the substrate adjacent to the trench. There is a need to develop new-methods of forming trench isolation structures and gate insulating layers that provide adequate, and even improved, isolation of neighboring semiconductor devices and/or isolation of the gate from the substrate.

SUMMARY OF THE INVENTION

Generally, the present invention relates to the formation of semiconductor devices that include trench isolation. One embodiment is a method of making a semiconductor device. A masking layer is formed over a substrate to expose a field region and cover an active region of the substrate. A trench is formed in the field region and filled with dielectric material. The substrate is oxidized to form a first sacrificial layer in the active region adjacent to the trench. The first sacrificial layer is removed. A second sacrificial layer is formed in the active region adjacent to the trench by oxidizing the substrate. The second sacrificial dielectric layer is removed. This often provides an improved surface for the subsequent formation of the gate insulating layer and gate electrode.

Another embodiment is another method of making a semiconductor device. A masking layer is formed over a substrate to expose a field region and cover an active region of the substrate. A trench is formed in the field region and filled with dielectric material. A nitrided oxide layer is formed over the active region of the substrate adjacent to the trench. The nitrided oxide layer is then removed. This also often provides an improved surface for the subsequent formation of the gate insulating layer and gate electrode.

Yet another embodiment is another method of making a semiconductor device. A masking layer is formed over a substrate to expose a field region and cover an active region of the substrate. A trench is formed in the field region. The trench is thermally oxidized in a nitrogen-bearing ambient to form a nitrided oxide liner layer. This often provides a trench that is resistant to diffusion of dopant material into the trench.

The above summary of the present invention is not intended to describe each illustrated embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
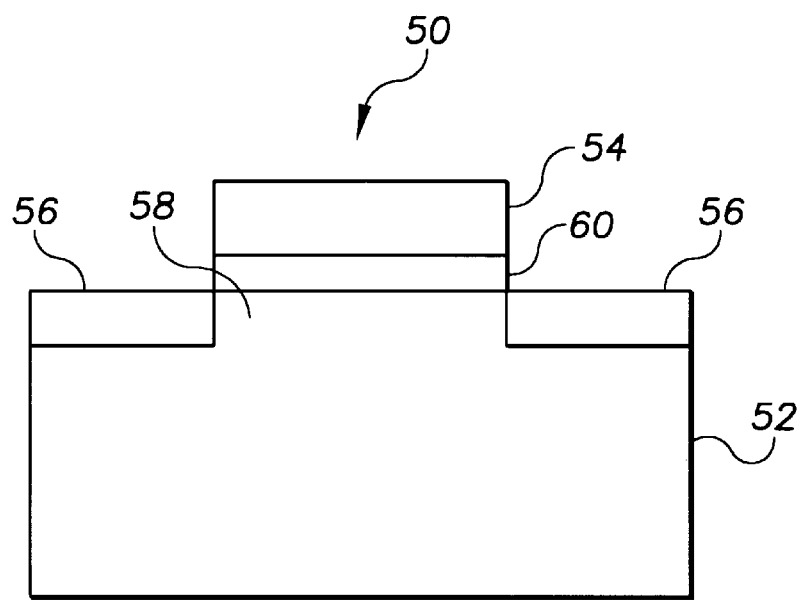
FIG. 1 illustrates a conventional MOS semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to the formation of semiconductor devices. The invention is particularly suited for the formation of semiconductor devices having gate insulating layers and trench isolation regions. While the present invention is not so limited, an appreciation of various aspects of the invention will be gained through a discussion of various application examples operating in such environments.

Figure 2A:
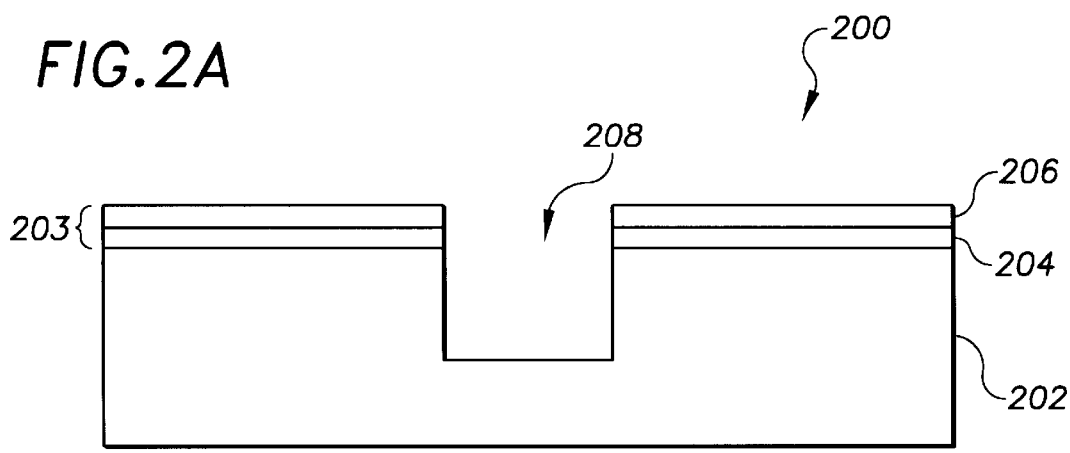
FIGS. 2A–2F illustrate one exemplary method for forming a semiconductor device according to the invention.

FIGS. 2A–2F illustrated an exemplary processing sequence for forming a semiconductor device 200. The process begins with the formation of a masking layer 203 on a substrate 202, as shown in FIG. 2A. The substrate 202 is a material such as silicon or some other semiconductor.

The masking layer 203 is formed using one or more dielectric layers. In one embodiment, the masking layer 203 has a first dielectric layer 204 and a second dielectric layer 206, as shown in FIG. 2A. The first dielectric layer 204 is typically formed using an oxide material, such as silicon dioxide. Often, this type of first dielectric layer 204 is referred to as a "pad oxide." The first dielectric layer 204 is typically formed, at least in part, to protect the substrate 202 from the second dielectric material, which is typically formed of a nitride that may cause stress when in direct contact with the substrate 202.

The first dielectric layer 204 can be formed using techniques, including, for example, chemical vapor deposition (CVD), physical vapor deposition, sputtering, or oxidation of the substrate 202. In particular, thermal oxidation in an oxygen-bearing ambient (e.g., $O_2$ or $H_2O$) typically produces an oxide material. The first dielectric layer 204 may have a thickness ranging from, for example, 50 to 600 angstroms.

The second dielectric layer 206 is typically formed using a material that allows for selective removal of the second dielectric layer 206 while leaving behind a subsequently deposited dielectric material 212 (see FIGS. 2C and 2D). The second dielectric layer 206 may be formed, for example, using a nitride material, such as silicon nitride, particularly when the dielectric material 212 includes an oxide material, such as silicon dioxide. The second dielectric layer 206 may be formed by such techniques as, for example, chemical vapor deposition (CVD), physical vapor deposition, or sputtering. The thickness of the second dielectric layer 206 can range from, for example, 300 to 3500 angstroms.

Although the masking layer 203 is exemplified as being formed from two dielectric layers, it will be understood that one dielectric layer (e.g., an oxide or nitride layer) or three or more layers can also be used.

After the formation of the masking layer 203, a trench 208 is formed in the substrate, as shown in FIG. 2A. The trench is typically used to separate subsequently formed active regions in neighboring MOS transistors. A variety of techniques may be used to form the trench 208. One exemplary technique includes depositing a photoresist layer (not shown) over the masking layer 203; patterning the photoresist layer using a mask (not shown); and developing the photoresist layer to expose regions of the masking layer 203. This may be done using, for example, well-known photolithographic techniques. The exposed regions of the masking layer 203 are removed to expose regions of the substrate 202. This may be done using, for example, known wet or dry etching techniques. Exposed regions of the substrate 202 may then be removed to form the trench 208 using, for example, known etching techniques, such as anisotropic etching.

The trench 208 defines a trench isolation region (e.g., a field region) in the device layer 202, that is typically between previously or subsequently formed active regions. Ideally, the trench 208 has straight or slightly tapered side walls with rounded edges at the bottom. However, these ideal trench attributes are not required. Typically trenches are between about 0.20 to 0.50 $\mu$m in depth, but trenches with other dimensions may also be formed. In some embodiments, a channel stop may be formed below the trench, by, for example, implanting a dopant material, such as boron, into the substrate below the trench to reduce or prevent latch-up.

Figure 2B:
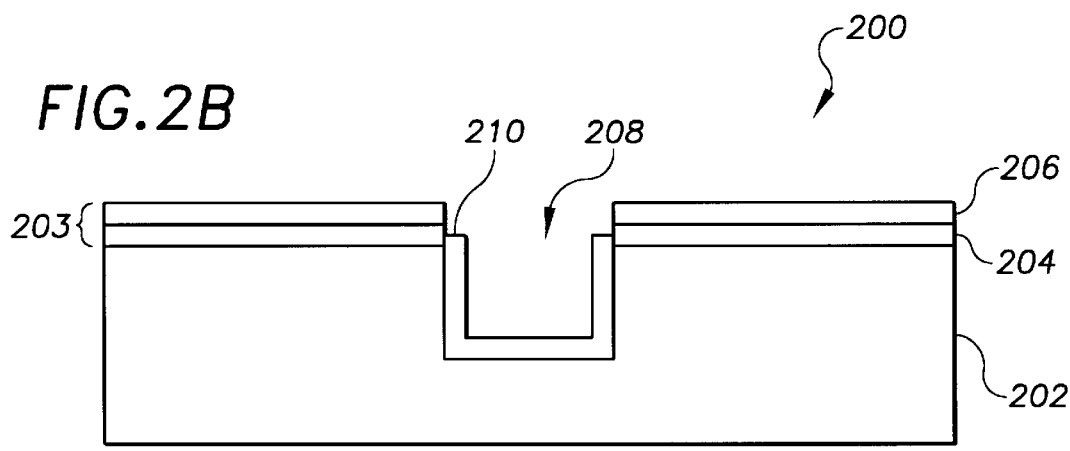

After the trench 208 is formed, an optional relatively thin (100 to 800 angstrom) liner layer 210 can be formed along the sidewalls and bottom of the trench 208, as shown in FIG. 2B. The formation of the thin liner layer 210 often smoothes the edges and corners of the trench 208. When the thin liner layer 210 is formed by thermal oxidation, a portion of the substrate 202 is oxidized. As a result, the sidewalls and bottom of the trench 208 recede.

In some embodiments, the optional thin liner layer 210 is made from a thermal oxide formed, for example, using known thermal oxidation techniques, including, for example, the thermally controlled oxidation of the silicon substrate using gaseous $O_2$ or $H_2O$ vapor. In other embodiments, the optional thin liner layer 210 is a nitrided oxide (e.g., $SiO_xN_y$) layer formed by thermal oxidation of the silicon substrate in a nitrogen-bearing ambient (such as NO or $N_2O$) and/or, alternatively, by an NO or $N_2O$ anneal after thermal oxidation of the silicon substrate to form a nitrided oxide. The use of a nitrogen-bearing ambient may be advantageous because nitrogen often diffuses to the silicon surface and forms silicon-nitrogen bonds that are typically stronger and more stable than silicon-oxygen bonds. In addition, nitrogen in the liner layer can prevent or reduce the diffusion of boron into the trench (which could reduce the effectiveness of the trench as an isolation structure).

Figure 2C:
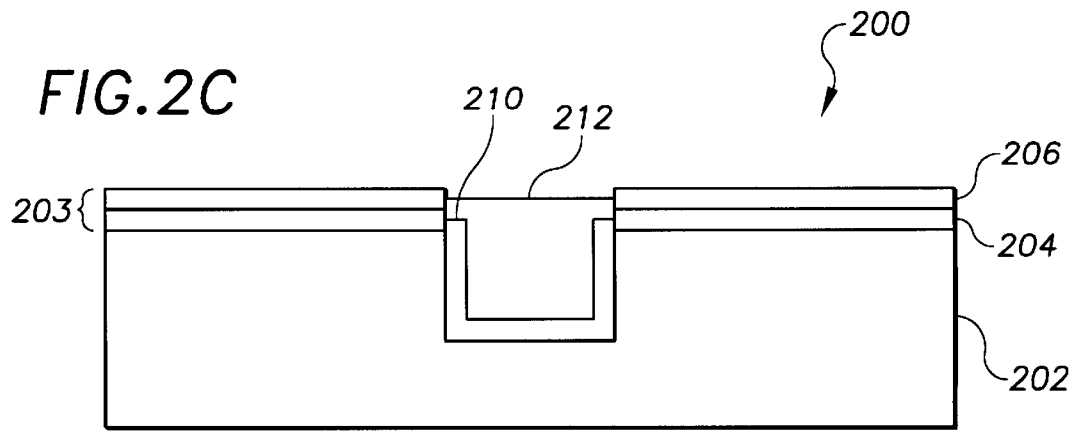

Next, the trench 208 is at least partially filled with a dielectric material 212, as illustrated in FIG. 2C. Often, the trench 208 is completely filled. Suitable dielectric materials 212 include, for example, oxides, such as silicon dioxide, or oxide-forming materials, such as hydrogen silsesquioxane (HSQ), tetraethylorthosilicate (TEOS), or a spin-on-glass.

A variety of methods may be used to form the dielectric material 212, including, for example, physical vapor deposition, chemical vapor deposition, and spin-on coating. Typically, these methods also deposit a portion of the dielectric material 212 over the second dielectric layer 206. This portion of the dielectric material 212 may be removed by a variety of techniques, including, for example, chemical polishing, mechanical polishing, or a combination thereof. Often the portion of the dielectric material 212 is removed by a selective technique that has a significantly smaller effect on the material of the masking layer 203. The masking layer 203 may be used as an etch or polish stop to indicate when a sufficient amount of the dielectric material 212 has been removed. The removal of a portion of the dielectric material 212 often leaves a relatively planar surface of the dielectric material 212 in the trench 208, which may, at least in some cases, be below the surface of the masking layer 203, due to, for example, overetching of the dielectric material 212.

Figure 2D:
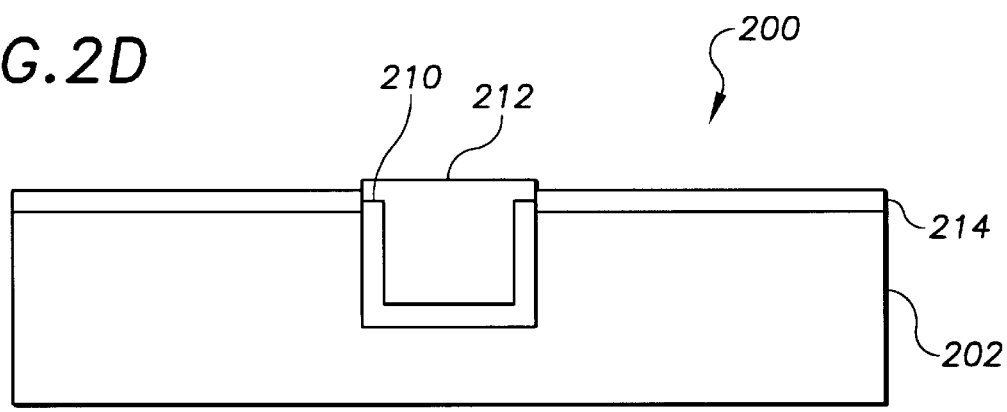

After filling the trench 208, the masking layer 203 is typically removed, as shown in FIG. 2D. Although the first and second dielectric layers 204, 206 of the masking layer 203 may be removed together, typically the two layers 206, 204 are removed separately to avoid removing too much of the dielectric material 212. The removal of the second dielectric layer 206 can be performed by standard techniques including, for example, an etching process that is selective to the material of the second dielectric layer 206. The first dielectric layer 204 is then removed. Typically, the removal of this layer also causes a removal of a portion of the dielectric material 212 because the first dielectric layer 204 and the dielectric material 212 are often both formed of similar materials. Thus, separate etching steps for the first and second dielectric layers 204, 206 often reduces that amount of the dielectric material 212 in or over the trench 208 that is removed.

It has been found that the upper edges/corners of the trench 208 near the now exposed substrate 202 are not uniform, particularly when an optional thin liner layer 210 is formed within the trench. For example, thermally oxidizing the trench sidewalls to form the liner layer 210 can result in a rounded corner as a portion of the substrate is oxidized. In addition, silicon nitride deposits are often formed under the masking layer 203 near the trench edge when the masking layer includes silicon nitride (e.g., as the second dielectric layer 206). These deposits may cause a thinning of a subsequently deposited dielectric layer, resulting in non-uniform properties. This is particularly important when the subsequently deposited dielectric layer is a gate insulating layer. Thinning of the gate insulating layer can result in a lower than expected breakdown voltage.

To reduce or prevent these difficulties, a first sacrificial layer 214 is formed over the substrate 202 adjacent to the trench 208. The first sacrificial layer 214 and any subsequent sacrificial layers are typically formed, at least in part, to improve the shape and characteristics of the trench and substrate, and, in particular, the upper edges/corners of the trench and the portion of the substrate adjacent to the trench. The first sacrificial layer 214 can have a thickness ranging from, for example, 50 to 300 angstroms.

The first sacrificial layer 214 is typically formed by thermal oxidation of the substrate material. The thermal oxidation can occur under conditions that result in the formation of an oxide layer (e.g., in an oxygen-bearing or $H_2O$-bearing ambient). Alternatively, the thermal oxidation can occur in a nitrogen-bearing ambient (NO or $N_2O$), and/or with an NO anneal after thermal oxidation (in any ambient) to form a nitrided oxide layer. Thermal oxidation in a nitrogen-bearing ambient may be advantageous because the thermal oxidation proceeds at a reduced rate under these conditions allowing for better control of layer thickness and the formation of higher quality layers. In addition, because of the reduced oxidation rate, higher processing temperatures may be used to further increase the quality of the first sacrificial layer 214. Moreover, the growth of a nitrided oxide layer is often self-limiting (i.e., the rate decreases as the layer becomes thicker), allowing for better control of the thickness and quality of the first sacrificial layer 214.

In some embodiments (not shown), a portion of the masking layer is not removed prior to forming the first sacrificial layer. Typically, this portion of the masking layer is formed from an oxide material. The first sacrificial layer can then be formed by oxidation, often in a nitrogen-bearing ambient, of the substrate beneath the remaining portion of the masking layer. Typically, the remaining portion of the masking layer has a thickness of about 50 angstroms or less so that the underlying substrate can be oxidized and/or nitrogen from a nitrogen-bearing ambient can diffuse through the remaining portion of the masking layer to the substrate.

After formation, the first sacrificial layer 214 is removed. This can be accomplished by a variety of methods, including, for example, wet and/or dry etching. Removal of the first sacrificial layer 214 can improve the corner of the trench and the surface of the substrate adjacent to the trench as a portion of the substrate is oxidized and subsequently removed.

The formation of a first sacrificial layer 214 from a nitrided oxide material may be beneficial as the nitrogen often travels to the silicon surface to form silicon-nitrogen bonds that are often stronger than silicon-oxygen bonds. This can often result in a better semiconductor/dielectric interface with increased robustness, more reliability, and, at least in some embodiments, fewer sites for the trapping of electrons and holes. In addition, although the first sacrificial layer 214 is removed, at least a portion of the nitrogen is left in the substrate. This nitrogen can reduce or prevent the diffusion of dopant material, such as boron, into a subsequently formed dielectric layer, such as, for example, a gate insulating layer, resulting in better and more uniform device properties. In addition, the nitrogen in the substrate can diffuse into the dielectric layer and/or gate electrode layer during subsequent processing steps, such as in annealing procedures, to form barriers to the diffusion of dopant material.

Figure 2E:
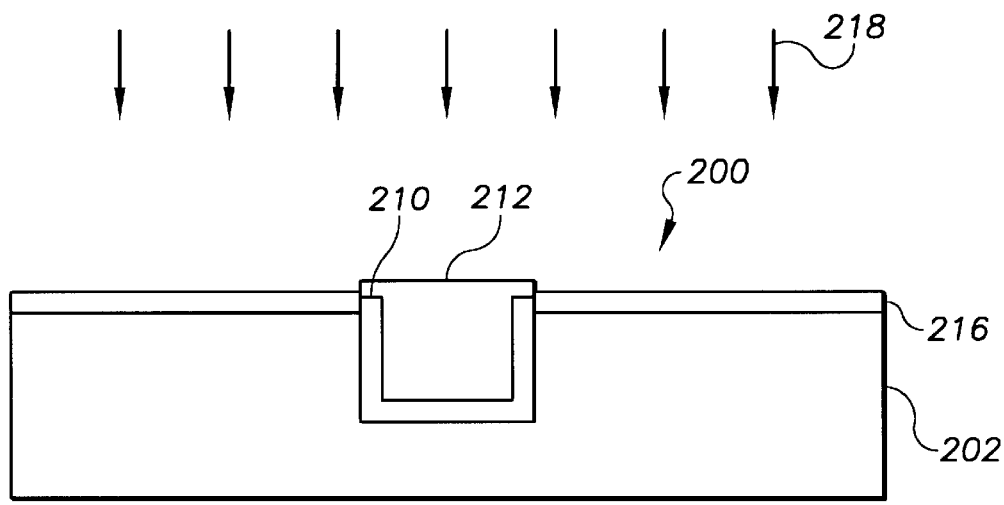

Although in some embodiments only one sacrificial layer 214 is used, in many embodiments of the invention two or more sacrificial layers are used. For example, in the exemplary process flow of FIGS. 2A–2F, a second sacrificial layer 216 is formed after removal of the first sacrificial layer 214, as shown in FIG. 2E. The second sacrificial layer 216 can have a thickness ranging from, for example, 50 to 300 angstroms.

The second sacrificial layer 216 is typically formed by thermal oxidation of the substrate material. The thermal oxidation can occur under conditions that result in the formation of an oxide layer (e.g., in an oxygen-bearing or $H_2O$-bearing ambient). Alternatively, the thermal oxidation can occur in a nitrogen-bearing ambient (e.g., NO or $N_2O$), and/or with an NO anneal after thermal oxidation (in any ambient) to form a nitrided oxide layer. Forming this additional sacrificial layer can increase the uniformity of the substrate surface and, if a nitrogen-bearing ambient is used, can provide additional nitrogen in the substrate (i.e., more nitrogen in the substrate than achievable with just one sacrificial layer) which can result in better and more uniform device properties.

After formation, the second sacrificial layer 216 is removed. This can be accomplished by a variety of methods, including, for example, wet and/or dry etching. Removal of the second sacrificial layer 216 can further improve the corner of the trench and the surface of the substrate adjacent the trench. Additional sacrificial layers can be formed and removed if desired.

Typically, at one or more points during the fabrication process, the substrate is implanted with n-and/or p-type dopant material. This can occur, for example, before or after the removal or formation of the first sacrificial layer 214 and/or before or after the removal or formation of the second sacrificial layer 216 or any other sacrificial layer. FIG. 2E illustrates an implant before the removal of the second sacrificial layer 216. Implants may be performed for a variety of reasons, including, for example, to form of p- or n-wells, to modify the voltage threshold of the channel, and/or to prevent or resist punchthrough of the channel. During these implant procedures, one or more portions of the substrate may be masked to prevent or restrict implantation in that portion. A variety of methods for forming these implants are known and may be used.

Figure 2F:
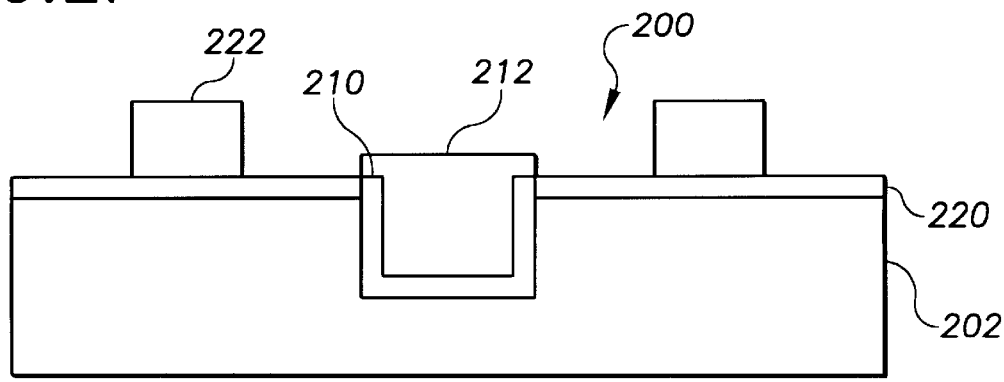

After removal of the last sacrificial layer, a gate insulating layer 220 may be formed, as shown in FIG. 2F. The gate insulating layer 220 is made of a dielectric material, such as, for example, silicon dioxide, silicon oxynitride, nitrided silicon dioxide, or other dielectric materials. The gate insulating layer 220 can be formed by a variety of methods, including, for example, physical vapor deposition, chemical vapor deposition, thermal oxidation in an oxygen-ambient to form an oxide material, thermal oxidation in a nitrogen-ambient to form a nitrided oxide material, or NO anneal after thermal oxidation of the silicon substrate to form a nitrided oxide.

A silicon dioxide gate insulating layer typically has a thickness ranging from, for example, 5 to 300 angstroms. Other gate insulating layers have thicknesses that provide a capacitance equivalent to, for example, a 5 to 300 angstrom layer of silicon dioxide. The gate insulating layer may be formed with a larger thickness and then a portion of the layer removed by, for example, wet or dry etching.

For example, a gate insulating layer 220 can be formed by thermal oxidation in a nitrogen-bearing ambient to form a nitrided oxide having a thickness ranging from, for example, 25 to 35 angstroms. The gate insulating layer may then be brought back to, for example, 5 to 25 angstroms by dipping or otherwise etching with HF or another etchant. Nitrogen in the gate insulating layer of a semiconductor MOS device serves to inhibit a dopant in the gate electrode (e.g., boron atoms in a PMOS device or arsenic or phosphorus atoms in an NMOS device) from diffusing through the gate insulating layer and into the channel region. The improved reliability and characteristics are typically more apparent in PMOS devices than in NMOS devices. For example, a PMOS device which employs a nitrogen-rich gate insulating layer may exhibit reduced off-state current as compared to an NMOS device formed over a similar gate insulating layer. In addition, nitrogen from the substrate may diffuse into an oxide or nitrided oxide gate insulating layer during, for example, subsequent annealing steps if, for example, nitrided oxide sacrificial layers were formed to permit the diffusion of nitrogen into the substrate.

Other process steps may then be performed including, for example, the formation of one or more gate electrodes 222, the formation of lightly-doped drain (LDD) regions in the substrate, the formation of spacers along sidewalls of the gate electrodes 222, and the formation of source and drain regions by dopant implantation.

As noted above, the present invention is applicable to a number of different devices and systems where trench isolation is used to isolate neighboring semiconductor devices. Accordingly, the present invention should not be considered limited to the particular examples described above, but rather should be understood to cover all aspects of the invention as fairly set out in the attached claims. Various modifications, equivalent processes, as well as numerous communication devices to which the present invention may be applicable will be readily apparent to those of skill in the art upon review of the present specification. The claims are intended to cover such modifications and devices.

We claim:

1. A method of forming a semiconductor device, comprising:

forming a masking layer over a substrate to expose a field region and cover an active region of the substrate;

forming a trench in the field region and a nitrided-oxide liner layer along sidewalls and a bottom surface of the trench and then filling the trench with dielectric material;

oxidizing the substrate to form a first sacrificial layer in the active region adjacent to the trench;

removing the first sacrificial layer;

oxidizing the substrate to form a second sacrificial layer in the active region adjacent to the trench; and removing the second sacrificial layer.

2. The method of claim 1, wherein forming the liner layer comprises thermally oxidizing the sidewalls and the bottom surface of the trench.

3. The method of claim 1, wherein thermally oxidizing the sidewalls and bottom surface of the trench comprises thermally oxidizing the sidewalls and bottom surface of the trench in a nitrogen-bearing ambient.

4. The method of claim 1, wherein oxidizing the substrate to form the first sacrificial layer comprises thermally oxidizing the substrate in a nitrogen-bearing ambient to form a first sacrificial nitrided oxide layer on the substrate and adjacent to the trench.

5. The method of claim 1, further comprising annealing the first sacrificial layer in a nitrogen-bearing ambient to form a first sacrificial nitrided oxide layer.

6. The method of claim 1, wherein oxidizing the substrate to form the second sacrificial layer comprises thermally oxidizing the substrate in a nitrogen-bearing ambient to form a second sacrificial nitrided oxide layer on the substrate and adjacent to the trench.

7. The method of claim 1, further comprising annealing the second sacrificial layer in a nitrogen-bearing ambient to form a second sacrificial nitrided oxide layer.

8. The method of claim 1, wherein forming a masking layer comprises forming a nitride layer over the substrate.

9. The method of claim 8, wherein forming a masking layer further comprises forming an oxide layer on the substrate prior to forming the nitride layer.

10. The method of claim 9, further comprising removing the nitride layer, leaving the oxide layer, prior to forming the first sacrificial layer.

11. The method of claim 1, further comprising removing the masking layer prior to forming the first sacrificial layer.

12. The method of claim 1, further comprising forming a gate insulating layer on the substrate after removing the second sacrificial layer.

13. The method of claim 12, wherein forming a gate insulating layer comprises thermally oxidizing the substrate to form a gate insulating layer.

14. The method of claim 13, wherein thermally oxidizing the substrate comprises thermally oxidizing the substrate in a nitrogen-bearing ambient to form a nitrided oxide gate insulating layer.

15. A method of forming a semiconductor device, comprising:

forming a masking layer over a substrate to expose a field region and cover an active region of the substrate;

forming a trench in the field region and filling the trench with dielectric material;

forming a nitrided oxide layer over the active region of the substrate adjacent to the trench; and removing the nitrided oxide layer.

16. The method of claim 15, further comprising forming a second nitrided oxide layer over the active region of the substrate and adjacent to the trench, and removing the second nitrided oxide layer.

17. The method of claim 15, further comprising forming a liner layer along sidewalls and a bottom surface of the trench prior to filling the trench with dielectric material.

18. The method of claim 17, wherein forming the liner layer comprises thermally oxidizing the sidewalls and the bottom surface of the trench in a nitrogen-bearing ambient to form a nitrided oxide material.

19. The method of claim 15, wherein forming a nitrided oxide layer comprises oxidizing the substrate in a nitrogen-bearing ambient to form a nitrided oxide layer over the active region of the substrate adjacent to the trench.

20. The method of claim 15, wherein forming a nitrided oxide layer comprises oxidizing the substrate to form an oxide layer over the active region of the substrate adjacent to the trench and annealing the oxide layer in a nitrogen-bearing ambient to form a nitrided oxide layer.

21. The method of claim 15, wherein forming a masking layer comprises forming an oxide layer on the substrate.

22. The method of claim 21, further comprising removing the oxide layer prior to forming the first sacrificial layer.

23. The method of claim 21, wherein the first sacrificial layer is formed with at least a portion of the oxide layer remaining on the substrate.

* * * * *

UNITED STATES PATENT AND TRADEMARK OFFICE
CERTIFICATE OF CORRECTION

PATENT NO. : 6,245,638 B1
DATED : June 12, 2001
INVENTOR(S) : Gardner et al.

It is certified that error appears in the above-identified patent and that said Letters Patent is hereby corrected as shown below:

Column 3,
Line 63, "oxide."The" should read -- oxide." The --.

Column 5,
Line 55, "edges/comers" should read -- edges/corners --.

Column 6,
Line 8, "edges/comers" should read -- edges/corners --.

Column 7,
Line 32, "n-and/or p-type" should read -- n- and/or p-type --.

Signed and Sealed this

Twenty-third Day of July, 2002

Attest:

Attesting Officer

JAMES E. ROGAN
*Director of the United States Patent and Trademark Office*